(12) United States Patent
Lee et al.

(10) Patent No.: US 9,034,565 B2
(45) Date of Patent: May 19, 2015

(54) METHOD OF FABRICATING SUBSTRATE FOR ORGANIC LIGHT-EMITTING DEVICE

(71) Applicant: Samsung Corning Precision Materials Co., Ltd., Gyeongsangbuk-do (KR)

(72) Inventors: Kiyeon Lee, ChungCheongNam-Do (KR); Jhee-Mann Kim, ChungCheongNam-Do (KR); Youngseok Lee, ChungCheongNam-Do (KR); Kyungmin Yoon, ChungCheongNam-Do (KR); Jaeho Lee, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/268,325

(22) Filed: May 2, 2014

(65) Prior Publication Data

US 2014/0329180 A1 Nov. 6, 2014

(30) Foreign Application Priority Data

May 6, 2013 (KR) .................. 10-2013-0050552

(51) Int. Cl.
*G03F 7/26* (2006.01)
*G03F 7/40* (2006.01)
*G03F 7/004* (2006.01)

(52) U.S. Cl.
CPC ................ *G03F 7/40* (2013.01); *G03F 7/0042* (2013.01)

(58) Field of Classification Search
CPC .................. H01J 11/36; H01J 2211/36; H01L 2924/01079; H01L 24/11; H01L 2924/01006; H01L 2924/01047; G03F 7/0047; G03F 1/54; G03F 7/40; G03F 7/70216; H05K 1/0306; H05K 3/002; H05K 3/0023; G03C 1/705
USPC .......... 430/322, 330, 313, 319, 320, 317, 311
See application file for complete search history.

(56) References Cited

U.S. PATENT DOCUMENTS 5,997,377 A * 12/1999 Sagara et al. .................. 445/24
6,511,793 B1 * 1/2003 Cho et al. ..................... 430/323

* cited by examiner

*Primary Examiner* — Caleen Sullivan
(74) *Attorney, Agent, or Firm* — Lerner, David, Littenberg, Krumholz & Mentlik, LLP

(57) ABSTRACT

A substrate for an organic light-emitting device which can improve the light extraction efficiency of an organic light-emitting device while realizing an intended level of transmittance, a method of fabricating the same, and an organic light-emitting device having the same. Light emitted from the OLED is emitted outward through the substrate. The substrate includes a substrate body and a number of crystallized particles disposed inside the substrate body, the number of crystallized particles forming a pattern inside the substrate body.

8 Claims, 4 Drawing Sheets

(a)            (b)            (c)

METHOD OF FABRICATING SUBSTRATE FOR ORGANIC LIGHT-EMITTING DEVICE

CROSS REFERENCE TO RELATED APPLICATION

The present application claims priority from Korean Patent Application Number 10-2013-0050552 filed on May 6, 2013, the entire contents of which are incorporated herein for all purposes by this reference.

BACKGROUND OF THE INVENTION

1. Field of the Invention

The present invention relates to a substrate for an organic light-emitting device, a method of fabricating the same, and an organic light-emitting device having the same, and more particularly, to a substrate which can improve the light extraction efficiency of an organic light-emitting device while realizing an intended level of transmittance, a method of fabricating the same, and an organic light-emitting device having the same.

2. Description of Related Art

In general, an organic light-emitting diode (OLED) includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons injected into the light-emitting layer recombine with each other in the light-emitting layer, thereby generating excitons. When the excitons transit from an excited state to a ground state, light is emitted.

Organic light-emitting displays including an OLED are divided into a passive matrix type and an active matrix type depending on the mechanism that drives the N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

When light generated by an OLED having an internal emission efficiency of 100% exits through, for example, a transparent conductive film made of indium tin oxide (ITO) and a glass substrate, its efficiency is about 17.5% according to Snell's Law. This decreased efficiency has a significant effect on the reduction in the internal and external luminous efficiencies in the organic light-emitting device using the glass substrate. In order to overcome this, the #transmittance efficiency is increased by increasing optical light extraction efficiency. Accordingly, a number of methods for increasing the optical light extraction efficiency are underway.

Light extraction techniques of the related art include a technique of treating a surface having a texture structure on a glass plate, the technique of applying microspheres to a glass surface on which ITO is deposited, the technique of applying micro-lenses on the glass surface on which ITO is deposited, the technique of using a mesa structure, the technique of using silica aerogel on ITO and the glass surface, and the like. Among these techniques, the technique of using silica aerogel had the effect of increasing the quantity of light by 100%. However, silica aerogel is very sensitive to moisture and is unstable, thereby resulting in the reduced longevity of the device. Accordingly, it was impossible to commercially use this technique.

In addition, although the technique of using the micro-lenses or mesa structure increased the external light efficiency, the fabricating cost was greatly increased. This consequently causes the problem of low practicability. In addition, in the technique of using microspheres, no increase in the external luminous efficiency appeared but only the wavelength was changed due to the dispersion of light. Therefore, the method of using the texture structure that has brought the efficiency increase of 30% to the organic light-emitting device is most advantageous in terms of the longevity and cost of the device. However, since glass is amorphous, it is very difficult to form the texture structure having a certain shape on the glass plate. In addition, even if the texture is formed on the glass plate, the flatness is lowered by the texture. Consequently, the texture structure is also formed on the surface of the anode that adjoins to the glass plate, whereby leakage current occurs. This consequently creates many problems in the structure or process. For example, when the texture structure is applied for internal light extraction, an additional planarization film is required.

The information disclosed in the Background of the Invention section is provided only for better understanding of the background of the invention, and should not be taken as an acknowledgment or any form of suggestion that this information forms a prior art that would already be known to a person skilled in the art.

RELATED ART DOCUMENT

Patent Document 1: U.S. Pat. No. 8,096,147 (Jan. 17, 2012)

BRIEF SUMMARY OF THE INVENTION

Various aspects of the present invention provide a substrate for an organic light-emitting device or a substrate which can improve the light extraction efficiency of an organic light-emitting device while realizing an intended level of transmittance, a method of fabricating the same, and an organic light-emitting device having the same.

In an aspect of the present invention, provided is a substrate for an organic light-emitting device through which light emitted from the OLED is emitted outward. The substrate includes a substrate body and a number of crystallized particles disposed inside the substrate body, the number of crystallized particles forming a pattern inside the substrate body.

According to an embodiment of the present invention, the pattern may occupy an area ranging from 50 to 90% of the substrate body.

The particle size of the number of crystallized particles may range from 10 to 100 nm.

The substrate body may be made of photosensitive glass.

The substrate body may be made of lithium silicate-based glass to which a photosensitive metal is added.

The refractive index of the substrate may be 1.65 or greater.

The transmittance of the substrate may be 50% or higher.

In another aspect of the present invention, provided is a method of fabricating a substrate for an organic light-emitting device. The method includes the following steps of: preparing a photosensitive glass substrate; disposing a photomask having a light-transmitting pattern over the photosensitive glass substrate; exposing the photosensitive glass substrate to radiation through the photomask; and heat-treating the photosensitive glass substrate that has been exposed to radiation, forming a number of patterned crystallized particles inside the photosensitive glass substrate.

According to an embodiment of the present invention, the photosensitive glass substrate may be made of lithium silicate-based glass to which a photosensitive metal is added.

In a further aspect of the present invention, provided is an organic light-emitting device including the above-mentioned substrate as a light extraction substrate through which light generated therefrom is emitted outward.

According to embodiments of the present invention, it is possible to control the refractive index of the substrate and the size of crystallized particles inside the substrate through heat treatment to the substrate. Since light generated from the OLED is scattered through the crystallized particles inside the substrate while passing through the substrate, the light extraction efficiency of the organic light-emitting device is increased and the transmittance of the substrate can be realized.

In addition, it is possible to improve the light extraction efficiency by increasing the transmission of light that propagates straight by arranging the crystallized particles into a specific pattern.

Furthermore, since the substrate made of transparent crystallization glass having a high surface flatness serves not only as an external light extraction layer but also as an internal light extraction layer of an organic light-emitting device, it is possible to further simplify the structure over a conventional organic light-emitting device in which an external light extraction layer and an internal light extraction layer are formed on both surfaces of a glass substrate. Accordingly, it is possible to realize structural firmness and preclude the external and internal light extraction layers and the planarization film that would otherwise be provided separate from the glass substrate, thereby simplifying the fabrication process and reducing the fabrication cost.

In addition, when the substrate made of transparent crystallization glass is applied for a light extraction substrate of an organic light-emitting device, it is possible to reduce power consumption of the organic light-emitting device through the improved light extraction efficiency of the organic light-emitting device. This can consequently minimize heat generation, thereby increasing the longevity of the organic light-emitting device.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
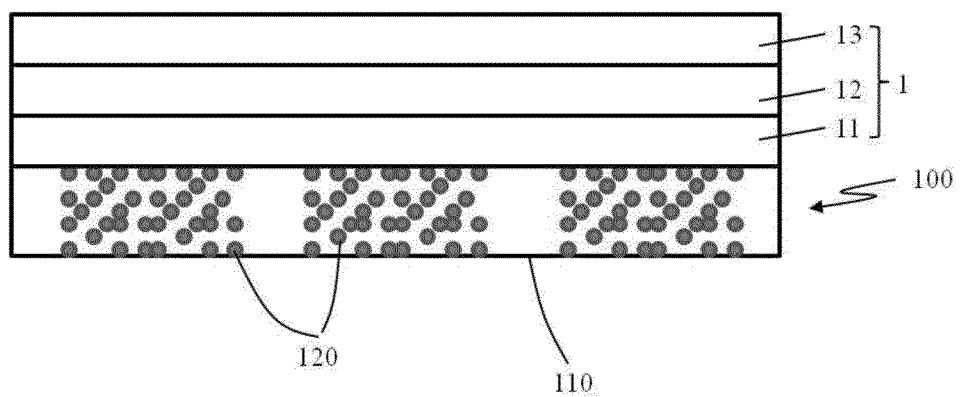
FIG. 1 is a cross-sectional view schematically showing a substrate for an organic light-emitting device and an organic light-emitting device having the same according to an exemplary embodiment of the invention.

Reference will now be made in detail to a substrate, a method of fabricating the same, and an organic light-emitting device having the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 2:
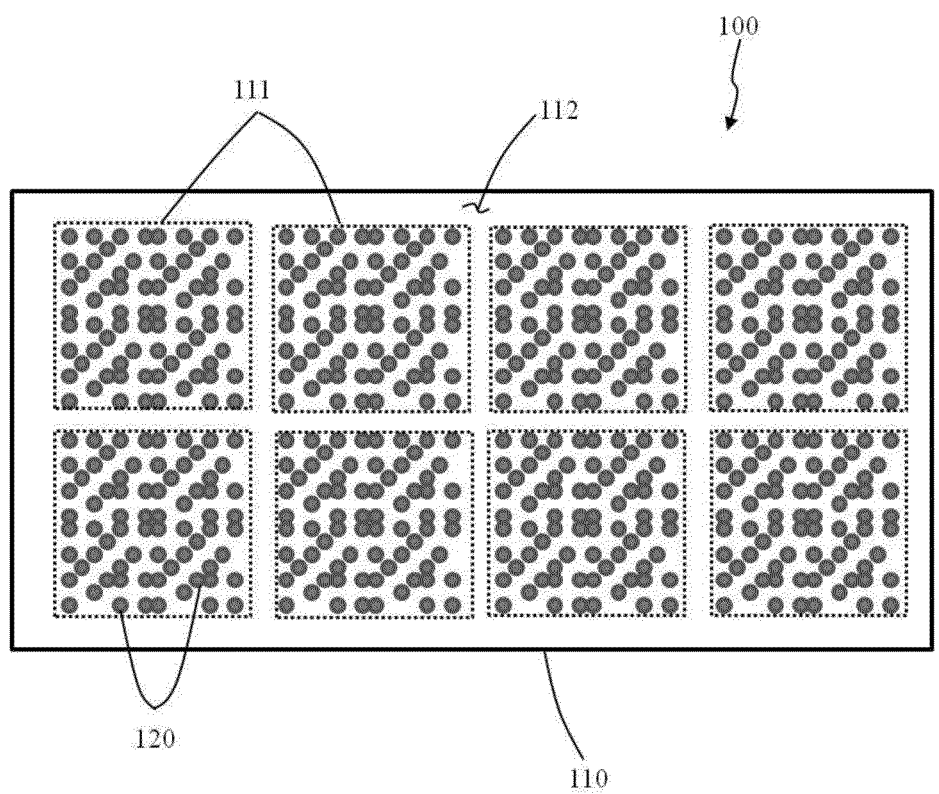
FIG. 2 is a top plan view showing the substrate according to an exemplary embodiment of the invention.

As shown in FIG. 1 and FIG. 2, a substrate 100 according to an exemplary embodiment of the invention is one of a pair of substrates of an organic light-emitting device which face each other and are bonded to each other to encapsulate the OLED 1. The substrate 100 is disposed on or bonded to one surface of the OLED 1, more particularly, the front surface of the OLED 1 through which light generated from the OLED 1 is emitted outward. The substrate 100 serves to protect the OLED 1 from external environment and acts as a path along which the light generated by the OLED 1 is extracted outward.

According to this exemplary embodiment, the substrate 100 is applied as a light extraction layer that improves the light extraction efficiency of the organic light-emitting device. Since the surface of the substrate 100 has a high level of flatness, the substrate 100 serves as both an internal light extraction layer and an external light extraction layer which are separate layers in the related art.

The OLED 1 has a multilayer structure which is sandwiched between the substrate 100 according to this exemplary embodiment and an encapsulation substrate which faces the substrate 100, and includes an anode 11, an organic light-emitting layer 12 and a cathode 13 which are stacked one on another. The anode 11 can be made of a metal, such as gold (Au), indium (In), tin (Sn), or a metal oxide, such as indium tin oxide (ITO), which has a significant work function in order to facilitate the hole injection. The cathode 13 can be made of a metal having a smaller work function in order to facilitate the electron injection. In a top emission type organic light-emitting device, the cathode can have a multilayer structure that includes a semitransparent electrode of a metal thin film made of Al, Al:Li or Mg:Ag and a transparent electrode of an oxide thin film made of, for example, indium tin oxide (ITO) in order to facilitate the transmission of light generated from the organic light-emitting layer. Although not shown in detail in the figures, the organic light-emitting layer 12 can include a hole injection layer, a hole transport layer, a light-emitting layer, an electron transport layer and an electron injection layer which are sequentially stacked on the anode 11. With this structure, when a forward voltage is applied between the anode 11 and the cathode 13, electrons from the cathode 13 migrate to the light-emitting layer through the electron injection layer and the electron transport layer, and holes from the anode 11 migrate to the light-emitting layer through the hole injection layer and the hole transport layer. The electrons and holes that have migrated into the light-emitting layer recombine with each other, thereby generating excitons. When these excitons transit from an excited state to a ground state, light is emitted. The brightness of the light emitted is proportional to the amount of current that flows between the anode 11 and the cathode 13.

The substrate 100 according to this exemplary embodiment includes a substrate body 110 and a number of crystallized particles 120.

The substrate body 110 allows the light generated from the OLED 1 to pass through it while protecting the OLED from the external environment. The number of crystallized particles 120 is disposed inside the substrate body 110. The substrate body 110 can be made of photosensitive glass. For instance, the substrate body 110 can be made of lithium silicate-based glass. An oxide, such as $CeO_2$ or $Al_2O_3$, or a metal, such as Ag or Sb, can be added to the lithium silicate-based glass, thereby making the substrate body 110 photosensitive. The reason why the substrate body 110 is made of the photosensitive glass is to form and pattern the crystallized particles 120 inside the substrate body 110 through exposure, which will be described in detail later in relation to the method of fabricating a substrate.

According to this exemplary embodiment, since the substrate body 110 is made of the lithium silicate-based glass having the above-mentioned composition, the refractive index of the substrate body 110 is 1.65 or greater after heat treatment for crystallization. As such, when the substrate body 110 has a high refractive index, the light generated from the OLED 1 can be more easily extracted.

The number of crystallized particles 120 is disposed inside the substrate body 110. The number of crystallized particles 120 is formed inside the substrate body 110 through the exposure and heat treatment of the substrate body 110 made of photosensitive glass. The process of heat-treating the substrate body 110 having an amorphous structure forms crystalline structures inside the substrate body 110. The crystallized particles 120 serve to scatter the light generated from the OLED 1, thereby improving the light extraction efficiency of the organic light-emitting device.

According to this exemplary embodiment, the size of the crystallized particles 120 may range from 10 to 100 nm. If the size of the crystallized particles 120 is smaller than 10 nm, the light-scattering ability of the crystallized particles 120 is lowered, thereby lowering the light extraction efficiency. In contrast, if the size of the crystallized particles 120 is greater than 100 nm, the transmittance is lowered, thereby lowering the efficiency of light that propagates straight.

According to this exemplary embodiment, the number of crystallized particles 120 forms a pattern inside the substrate body 110. The substrate body 110 is made of photosensitive glass in order to pattern the number of crystallized particles 120 which is formed during the crystallization process. When the number of crystallized particles 120 is patterned into a predetermined geometry, it is possible to further increase the transmission of light that propagates straight.

According to this exemplary embodiment, the pattern composed of the number of crystallized particles 120 is present in 50 to 90% of the area of the substrate body 110. That is, the substrate body 110 has a crystallinity ranging from 50 to 90%. At a crystallinity of the substrate body 110 less than 50%, the light extraction efficiency of the organic light-emitting device is lowered. At a crystallinity of the substrate body 110 greater than 90%, the transmittance of the substrate body 110 is lowered. The pattern of the number of crystallized particles 120 can be a lattice pattern or a variety of other patterns such as an irregular pattern.

Figure 3:
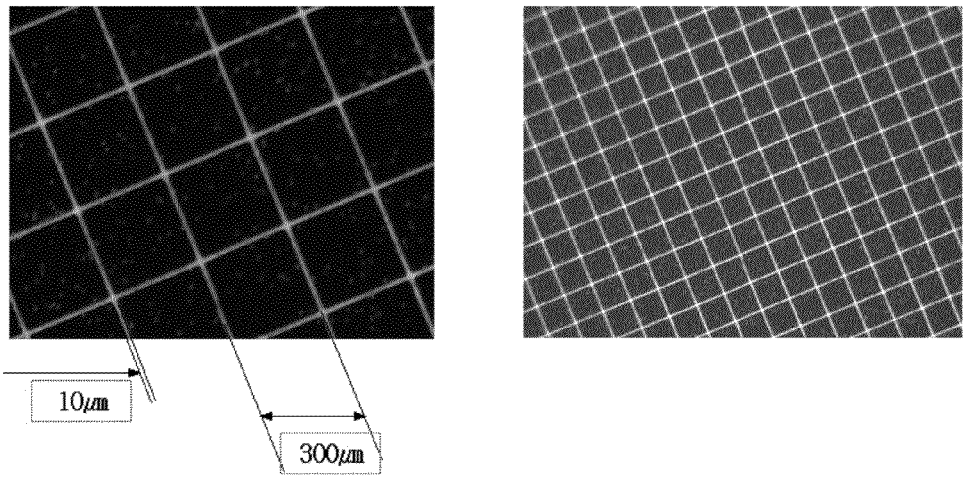
FIG. 3 is a picture taken from the surface of a substrate according to an exemplary embodiment of the invention.

As shown in FIG. 2 and FIG. 3, as the number of crystallized particles 120 is patterned, the substrate body 110 is divided into two areas, i.e. a patterned area 111 and a non-patterned section 112. The patterned area 111 is the area where the number of crystallized particles 120 is densely populated, and serves to scatter the light generated from the OLED 1. The non-patterned area 112 is composed of an amorphous structure that is not crystallized, and serves to increase the transmission of light that propagates straight such that the substrate body 110 can attain a predetermined level of transmittance, for example, a transmittance of 50% or greater.

As described above, the substrate 100 including the substrate body 110 and the number of crystallized particles 120 which is patterned inside the substrate body 110 can not only improve the light extraction layer for the light generated from the OLED 1 but also realize an intended level of transmittance. Since the light-scattering structure is located inside the substrate body 110, the surface of the substrate 100 forms a high-flatness surface having a surface roughness of 1 μm or less. Accordingly, the substrate 100 according to this exemplary embodiment can serve not only as an external light extraction layer but also as an internal light extraction layer of the organic light-emitting device.

In addition, the substrate 100 according to this exemplary embodiment applied as a light extraction layer of the organic light-emitting device can improve the light extraction efficiency of the organic light-emitting device, thereby reducing the power consumption of the organic light-emitting device. This can consequently minimize heat generation, thereby increasing the longevity of the organic light-emitting device.

Reference will not be made to a method of fabricating a substrate according to an exemplary embodiment of the invention in conjunction with FIG. 4 to FIG. 8.

Figure 4:
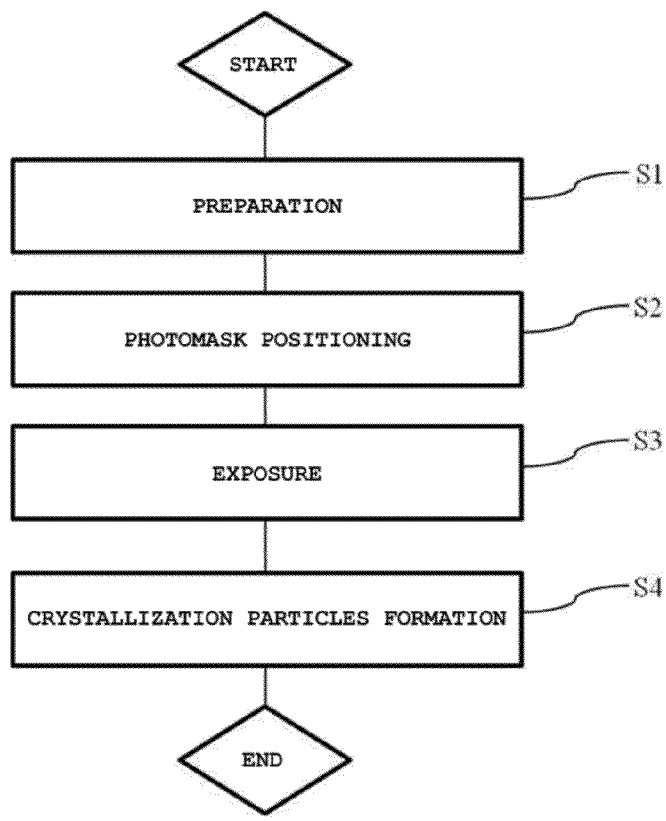
FIG. 4 is a process flowchart showing a method of fabricating a substrate according to an exemplary embodiment of the invention.

As shown in FIG. 4, the method of fabricating a substrate according to this exemplary embodiment includes a substrate preparation step S1, a photomask positioning step S2, an exposure step S3 and a crystallized particle forming step S4.

Figure 5:
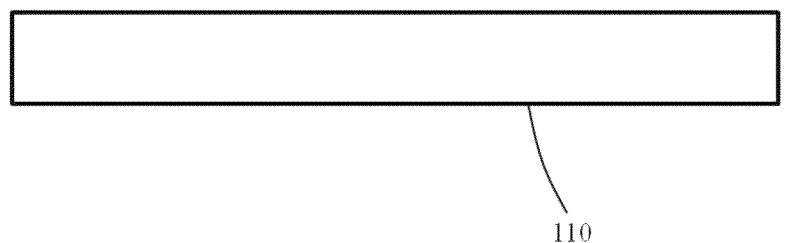
FIG. 5 to FIG. 7 are process views schematically showing the sequence of the method of fabricating a substrate according to an exemplary embodiment of the invention.

First, as shown in FIG. 5, at the preparation step S1, a photosensitive glass substrate 110 which corresponds to the above-mentioned substrate body (110 in FIG. 1) is prepared. The photosensitive glass substrate 110 can be made of lithium silicate glass. Specifically, glass compositions as presented in Table 1 below can be used for the photosensitive glass substrate 110.

TABLE 1

|  | Composition 1 (%) | Composition 2 (%) |
| --- | --- | --- |
| $SiO_2$ | 79.6 | 71.66 |
| $Li_2O$ | 10 | 11 |
| $Al_2O_3$ | 4 | 6 |
| ZnO |  | 2 |
| $K_2O$ | 4.3 | 6 |
| $CeO_2$ | 0.014 | 0.04 |
| $Ag_2O$ | 0.12 | 0.15 |
| $Sb_2O_3$ | 0.4 | 0.4 |
| $Na_2O$ | 1.6 | 2 |
| $B_2O_3$ |  | 0.75 |

Figure 6:
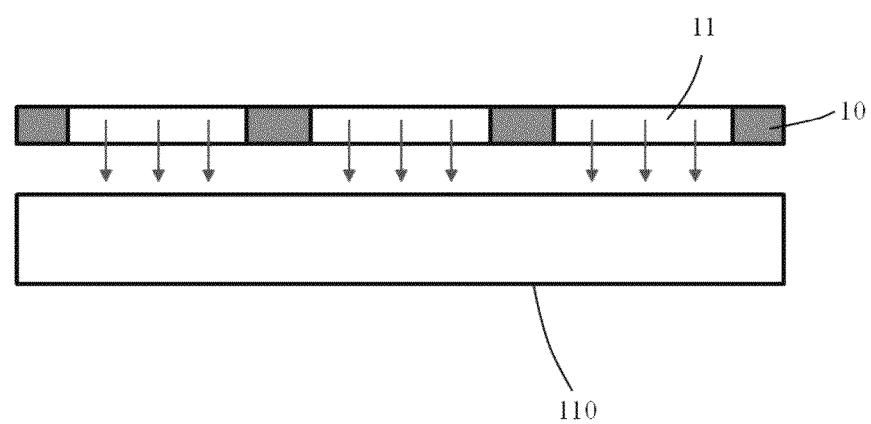

Afterwards, as shown in FIG. 6, at the photomask positioning step S2, a photomask 10 having a light-transmitting pattern 11 is disposed over the photosensitive glass substrate 110. The crystallinity of the photosensitive glass substrate 110 and the shape of the pattern defined by a number of crystallized particles (120 in FIG. 7) are determined by the size and shape of the light-transmitting pattern 11 of the photomask 110. According to this exemplary embodiment, it is possible to pattern the light-transmitting pattern 11 of the photomask 10 such that the area defined by the number of crystallized particles (120 in FIG. 7) ranges from 50 to 90% of the photosensitive glass substrate 110. When the number of crystallized particles (120 in FIG. 7) is patterned in this range, it is possible to improve the light extraction efficiency while realizing an intended level of transmittance, for example, a transmittance of 50% or greater.

Sequentially, at the exposure step S3, the photosensitive glass substrate 110 is exposed to radiation through the photomask 10. According to this exemplary embodiment, the photosensitive glass substrate 110 is exposed to ultraviolet (UV) radiation. During the exposure, the UV radiation is radiated onto the photosensitive glass substrate 110 through the light-transmitting pattern 11 of the photomask 10.

Figure 7:
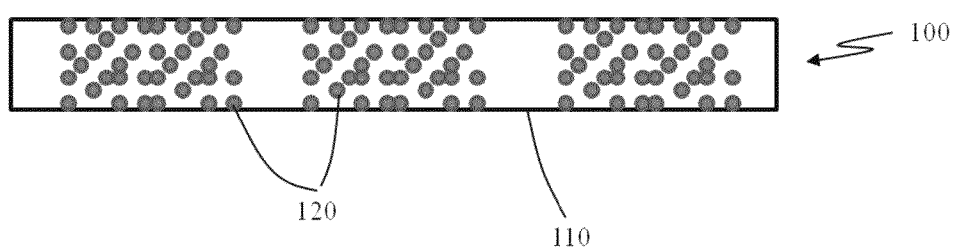
Figure 8:
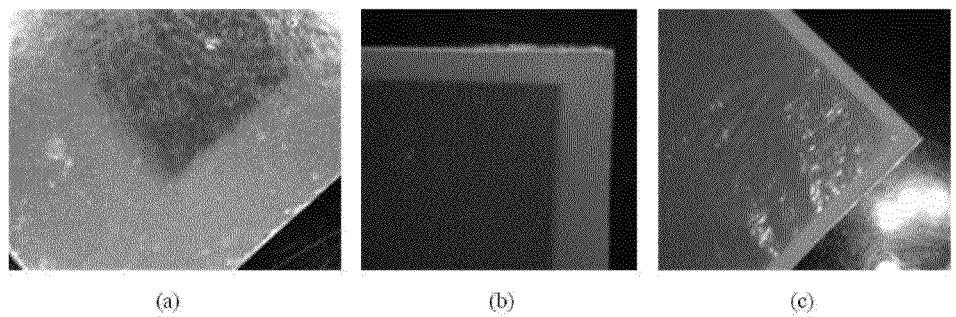
FIG. 8 is pictures of a substrate that was crystallized after being exposed to radiation in the method of fabricating a substrate according to an exemplary embodiment of the invention.

Finally, as shown in FIG. 7, at the crystallized particle forming step S4, the photosensitive glass substrate 110 that has been exposed radiation is heat-treated. When the photosensitive glass substrate 110 that has been exposed radiation is heat-treated, metal ions in the exposed area of the photosensitive glass substrate 110 that have been transited by the exposure are caused to react with photosensitive metal ions inside the photosensitive glass substrate 110. Consequently, the metal ions are precipitated, and as shown in pictures of FIG. 8, the crystallized particles 120 made of $SiO_2$, $Li_2O$, or so on are formed around the precipitated metal ions that act as nuclei in the exposed area of the photosensitive glass substrate 110. Here, the number of crystallized particles 120 formed in this manner is patterned into a geometry corresponding to that of the light-transmitting pattern 11 of the photomask 10. According to this exemplary embodiment, heat treatment conditions can be set such that the size of the formed crystallized particles 120 ranges from 10 to 100 nm in order to improve the light extraction efficiency while realizing an intended level of transmittance. In this manner, the size of crystallized particles 120 can be controlled by adjusting the heat treatment conditions. According to this exemplary embodiment, in order to control the size of the crystallized particles 120 in this range, the photosensitive glass substrate 110 that has been exposed to radiation can be heat-treated at a temperature ranging from 400 to 500° C.

In the photosensitive glass substrate 110 having the composition 1 in Table 1, the refractive index before the heat treatment was measured 1.502, and after the heat treatment for crystallization, an increase to 1.658 was measured. In the photosensitive glass substrate 110 having the composition 2 in Table 1, the refractive index before the heat treatment was measured 1.515, and after the heat treatment, an increase to 1.658 was measured.

In addition, since the number of crystallized particles 120 is formed inside the photosensitive glass substrate 110, the surface of the photosensitive glass substrate 110 forms a high-flatness surface having a surface roughness of 1 μm or less.

According to this exemplary embodiment, it is possible to fabricate the substrate 100 which includes the photosensitive glass substrate 110 and the crystallized particles 120 such that the substrate 100 has a refractive index of 1.65 or greater, a transmittance of 50% or higher and a surface roughness of 1 μm or less. The substrate 100 can be used not only as an external light extraction layer but also as an internal light extraction layer of the organic light-emitting device.

When the substrate 100 is fabricated by the method of fabricating a substrate according to this exemplary embodiment, it is possible to further simplify the structure over a conventional organic light-emitting device in which external and internal light extraction layers are respectively formed on both surfaces of a glass substrate. This consequently makes it possible to realize structural firmness and preclude the external and internal light extraction layers and the planarization film that would otherwise be provided separate from the glass substrate, thereby simplifying the fabrication process and reducing the fabrication cost.

The foregoing descriptions of specific exemplary embodiments of the present invention have been presented with respect to the drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A method of fabricating an organic light-emitting device, comprising:
    preparing a photosensitive glass substrate;
    disposing a photomask having a light-transmitting pattern over the photosensitive glass substrate;
    exposing the photosensitive glass substrate to radiation through the photomask;
    heat-treating the photosensitive glass substrate that has been exposed to the radiation, forming a number of crystallized particles in a pattern inside the photosensitive glass substrate; and
    disposing the photosensitive glass substrate such that light emitted from an organic light emitting diode is emitted outward through the photosensitive glass substrate.

2. The method according to claim 1, wherein the photosensitive glass substrate is made of lithium silicate-based glass to which a photosensitive metal is added.

3. The method according to claim 2, wherein the photosensitive metal comprises at least one of $CeO_2$, $Al_2O_3$, Ag and Sb.

4. The method according to claim 1, wherein an exposure area exposed to the radiation ranges from 50 to 90% of the substrate body.

5. The method according to claim 1, wherein a particle size of the number of crystallized particles ranges from 10 to 100 nm.

6. The method according to claim 1, wherein a refractive index of the substrate is 1.65 or greater.

7. The method according to claim 1, wherein a visible transmittance of the substrate is 50% or higher.

8. The method according to claim 1, wherein a surface roughness ($R_{RMS}$) of the substrate is 1 μm or less.

* * * * *